US010794982B2

(12) United States Patent
Newlin

(10) Patent No.: US 10,794,982 B2
(45) Date of Patent: Oct. 6, 2020

(54) DYNAMIC CALIBRATION OF CURRENT SENSE FOR SWITCHING CONVERTERS

(71) Applicant: NXP USA, Inc., Austin, TX (US)

(72) Inventor: Trevor Mark Newlin, Mesa, AZ (US)

(73) Assignee: NXP USA, Inc., Austin, TX (US)

(*) Notice: Subject to any disclaimer, the term of this patent is extended or adjusted under 35 U.S.C. 154(b) by 185 days.

(21) Appl. No.: 16/198,643

(22) Filed: Nov. 21, 2018

(65) Prior Publication Data
US 2020/0158808 A1 May 21, 2020

(51) Int. Cl.
G01R 35/00 (2006.01)
G01R 19/32 (2006.01)
G01R 19/25 (2006.01)
H02M 3/158 (2006.01)
H02M 1/00 (2006.01)

(52) U.S. Cl.
CPC ........... G01R 35/005 (2013.01); G01R 19/32 (2013.01); G01R 19/2513 (2013.01); H02M 3/158 (2013.01); H02M 2001/0009 (2013.01); H02M 2001/0012 (2013.01)

(58) Field of Classification Search
CPC .. G01R 35/005; G01R 19/25; G01R 19/2513; G01R 19/32; G01R 19/0092; G01R 31/40; H02M 3/158; H02M 2001/0009; H02M 2001/0012
See application file for complete search history.

(56) References Cited

U.S. PATENT DOCUMENTS

| 6,066,976 A * | 5/2000 | Cho ................... G01R 19/0092 327/337 |
| 6,377,034 B1 | 4/2002 | Ivanov |
| 6,559,684 B2 | 5/2003 | Goodfellow et al. |
| 8,587,974 B2 * | 11/2013 | Jonsson ................. H02P 27/08 363/98 |
| 9,326,335 B1 * | 4/2016 | Milanesi ............ G01R 19/0092 |
| 10,224,812 B1 * | 3/2019 | Sen ....................... H02M 3/158 |
| 10,310,528 B1 * | 6/2019 | Elsayed .................. G05F 1/575 |
| 10,581,446 B1 * | 3/2020 | Braswell ............... H03M 1/365 |
| 2007/0200538 A1 * | 8/2007 | Tang ..................... H02M 3/158 323/237 |
| 2007/0279025 A1 * | 12/2007 | Xu ...................... H02M 3/1588 323/282 |

(Continued)

Primary Examiner — Yusef A Ahmed
(74) Attorney, Agent, or Firm — Charlene R. Jacobsen

(57) ABSTRACT

A method for dynamic calibration of current sense for switching converters includes biasing a reference transistor with a Zero Temperature Coefficient current source, and a respective gate of each of the reference transistor and a power transistor with a gate voltage. The reference transistor and the power transistor each comprise a matching temperature coefficient. A reference voltage sensed across the reference transistor is multiplied by a gain, thereby generating a first calibration voltage, wherein the gain is determined by a gain coefficient. A transistor voltage sensed across the power transistor is multiplied by the gain, thereby generating a second calibration voltage. The first calibration voltage is compared to a target voltage to generate an error voltage. The gain coefficient is determined with an Analog to Digital Converter in response to the error voltage, thereby minimizing a difference between the target voltage and each of the calibration voltages.

20 Claims, 5 Drawing Sheets

(56) References Cited

U.S. PATENT DOCUMENTS

| | | | |
|---|---|---|---|
| 2012/0200274 A1* | 8/2012 | Tang | H02M 3/1584 323/271 |
| 2013/0249518 A1* | 9/2013 | Giannopoulos | H02M 3/156 323/284 |
| 2015/0061392 A1 | 3/2015 | Berard | |
| 2015/0377717 A1* | 12/2015 | Rollin | H02P 27/06 318/400.26 |
| 2016/0065067 A1* | 3/2016 | Isham | G01K 13/00 323/271 |
| 2016/0124030 A1* | 5/2016 | Zhang | G01R 19/0092 324/605 |
| 2016/0291631 A1* | 10/2016 | Sen | H02M 3/158 |
| 2017/0149343 A1* | 5/2017 | Bhandarkar | G01R 31/64 |
| 2017/0212154 A1* | 7/2017 | Otsuka | H03K 17/6872 |
| 2017/0229962 A1* | 8/2017 | Bansal | H02M 3/158 |
| 2018/0059151 A1* | 3/2018 | Trescases | G01R 15/06 |
| 2018/0109187 A1* | 4/2018 | Eggermont | G05F 1/56 |
| 2018/0219484 A1* | 8/2018 | Mercer | G01R 1/203 |
| 2019/0238124 A1* | 8/2019 | Tajima | G01R 19/32 |
| 2019/0293691 A1* | 9/2019 | Holland | H03F 3/45937 |
| 2019/0377012 A1* | 12/2019 | Soo | G01R 1/203 |
| 2020/0076303 A1* | 3/2020 | Sarkka | H02M 3/158 |

\* cited by examiner

DYNAMIC CALIBRATION OF CURRENT SENSE FOR SWITCHING CONVERTERS

FIELD

This disclosure relates generally to temperature compensation, and more specifically to temperature compensation of an output stage of a Pulse Width Modulated (PWM) power converter.

BACKGROUND

Switching converters typically convert a variable input voltage to supply a regulated power output over a wide temperature range. Regulation of the supplied power may include monitoring output current and/or voltage characteristics to regulate a switching frequency of a PWM stage designed to switch power Field Effect Transistors (FETs). For proper power regulation, the temperature dependence of the power FETs requires compensation.

Existing temperature compensation techniques include the use of external components, which adds considerable cost and often additional connections or component level pins for the converter. Power converter efficiency is also an important design goal, hence lossless methods of temperature compensation are usually preferred. However, techniques to sense and compensate for FET temperature characteristics have been relatively slow and consume a lot of power.

Other techniques based on sense FET topologies can give good performance at lower switching frequencies but have limited bandwidth and become too limited for use at higher switching frequencies (e.g., above 2 MHz). Depending on the ratio used, the sense current using this technique can reduce the system efficiency at lighter loads.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for lossless compensation of FET current variance due to temperature dependencies, fabrication process variation and input voltage changes. A separate calibration FET is used outside of the switching converter's inner control loop resulting in high-speed and accurate compensation. The calibration FET is biased with a Zero Temperature Coefficient (ZTC) current source to detect temperature variations and is used to adjust the gain of amplifiers used in the inner control loop of the switching converter. Specifically, the ZTC current source, as referred to throughout this disclosure, has a temperature coefficient significantly lower than a respective temperature coefficient of the transistor biased by the ZTC current source. Accordingly, temperature variations of the ZTC current source are insignificant compared to the temperature variations of the transistor being calibrated.

Figure 1:
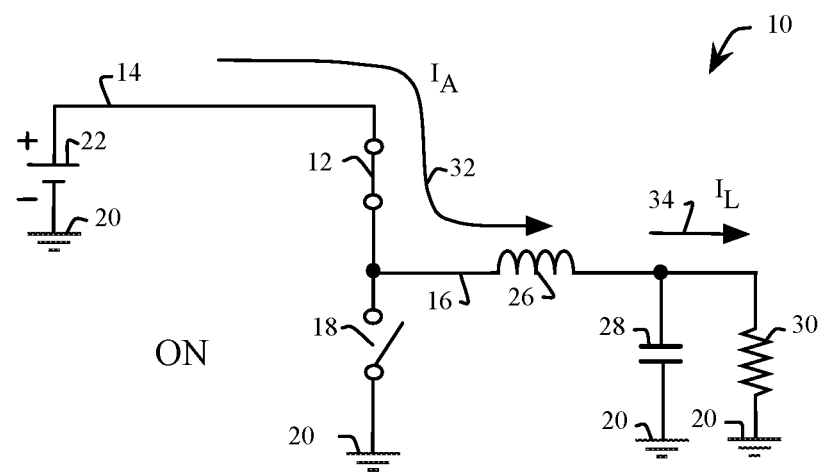
FIG. 1 is a schematic view of an embodiment of an output driver of a Pulse Width Modulated (PWM) power converter in an ON state.

FIG. 1 shows an embodiment 10 of an output stage of a buck PWM converter. A high-side switch 12 is connected between a voltage supply node 14 and a phase node 16. A low-side switch 18 is connected between the phase node 16 and a ground 20. The voltage supply node 14 includes a voltage supply 22 connect to ground 20. The phase node 16 is connected to a load inductor 26. The load inductor 26 connects to a load capacitor 28 connected to ground 20 and a load resistor 30 connected to ground 20. The embodiment 10 shows a PWM converter in the ON configuration, wherein the high-side switch 12 is closed, the low-side switch 18 is open, and a current 32 flows from the voltage supply 22 through the load inductor 26, thereby producing a load current 34.

Figure 2:
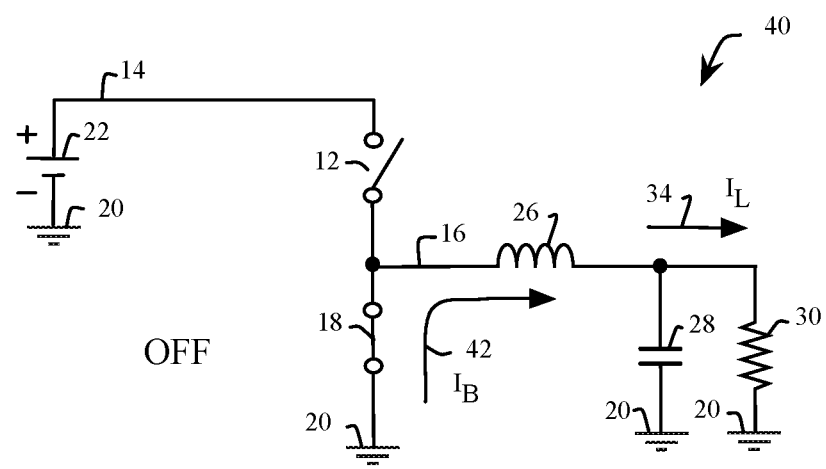
FIG. 2 is a schematic view of an embodiment of an output driver of a PWM power converter in an OFF state.
Figure 3:
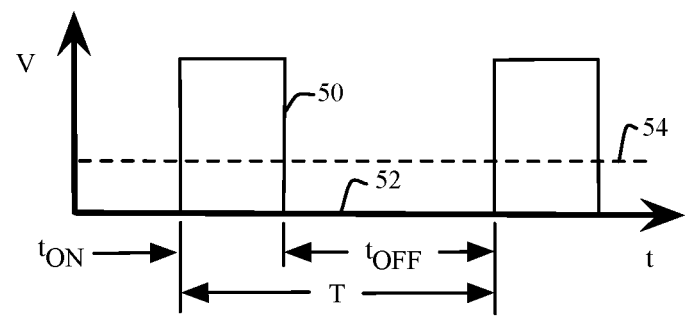
FIG. 3 is a graphical view of timing waveforms of the embodiments of FIG. 1 and FIG. 2 showing switch activation.

FIG. 2 shows an embodiment 40, similar to the embodiment 10 of FIG. 1, in an OFF configuration. In FIG. 2, the high-side switch 12 is open, the low-side switch 18 is closed, and a current 42 flows from the ground 20 through the load inductor 26, thereby producing the load current 34. FIG. 3 shows the timing of activating the high-side switch 12 and the low-side switch 18 of FIG. 1 and FIG. 2. During the time pulse 50, the high-side switch 12 is on and the low-side switch 18 is off, corresponding to the ON configuration shown in FIG. 1. During the timing pulse 52, the high-side switch 12 is off and the low-side switch 18 is on, corresponding to the OFF configuration shown in FIG. 2. Consequently, an output voltage 54 is formed across the load capacitor 28.

Figure 4:
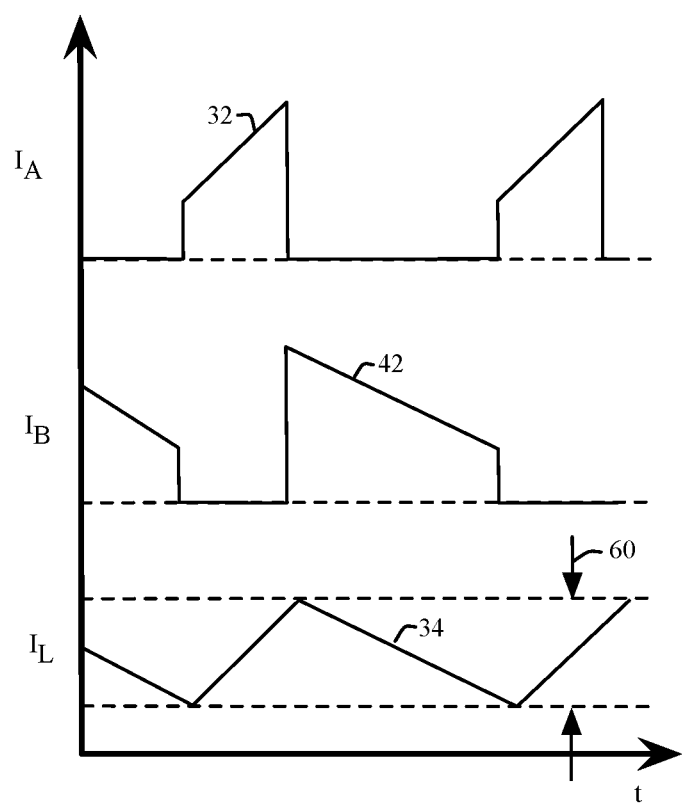
FIG. 4 is a graphical view of timing waveforms of the embodiments of FIG. 1 and FIG. 2 showing output current.

FIG. 4 shows the currents of FIG. 1 and FIG. 2 in relation to the switch timing of FIG. 3. Specifically, during the timing pulse 50, the high-side switch 12 is closed and current 32 ($I_A$) flows, causing an increase in the load current 34 ($I_L$). During the timing pulse 52, the low-side switch 18 is closed and current 42 ($I_B$) flows, causing a decrease in the load current 34 ($I_L$). The two currents 32 and 42 flowing in an interleaved fashion form the load current 34 shown as a saw tooth pattern with a current range 60. The current range 60 is smoothed (e.g., filtered) by the load capacitor 28, thereby producing the output voltage 54.

Figure 5:
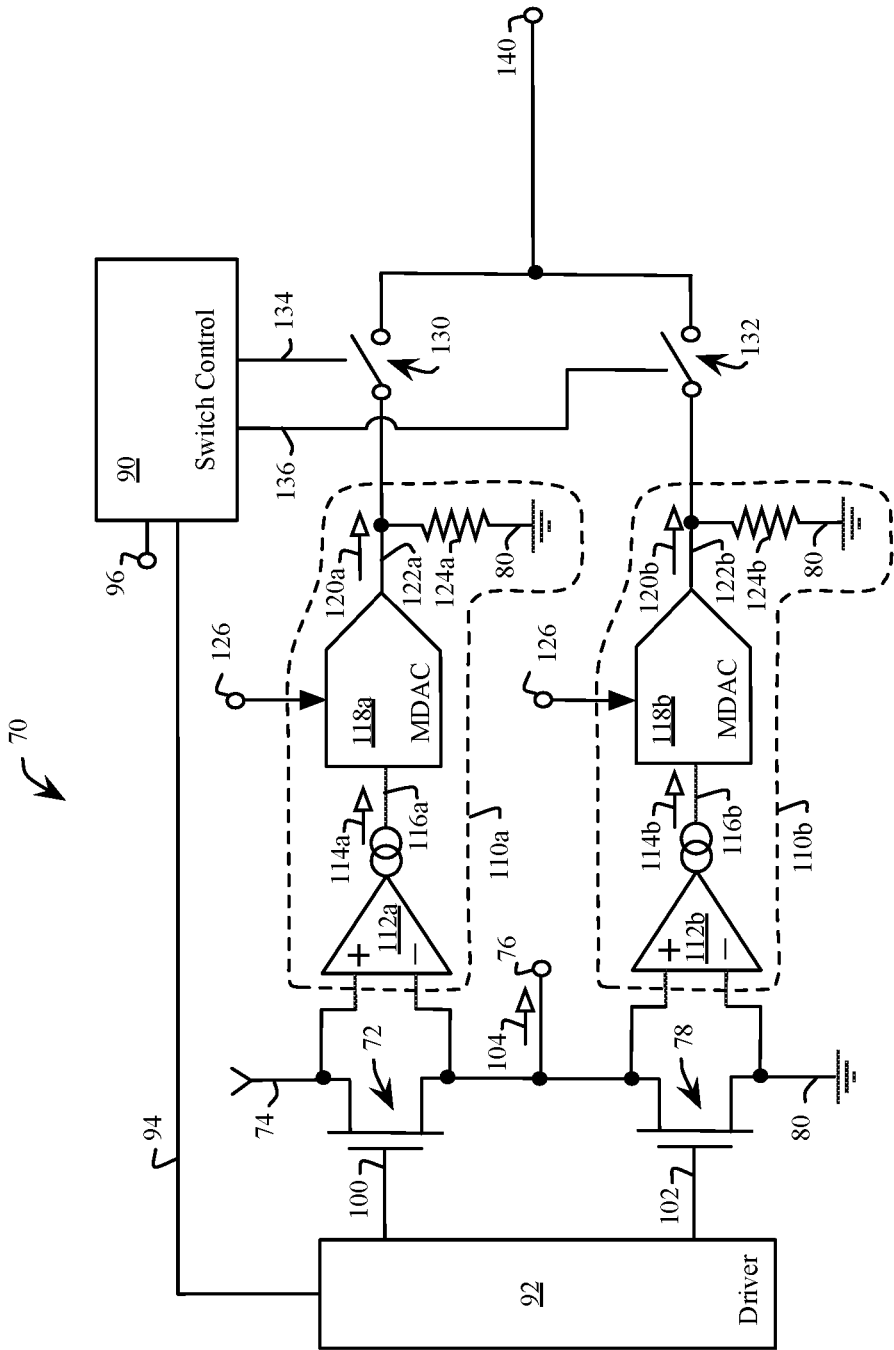
FIG. 5 is a schematic view of a current sense system in accordance with an example embodiment of the present disclosure.
Figure 6:
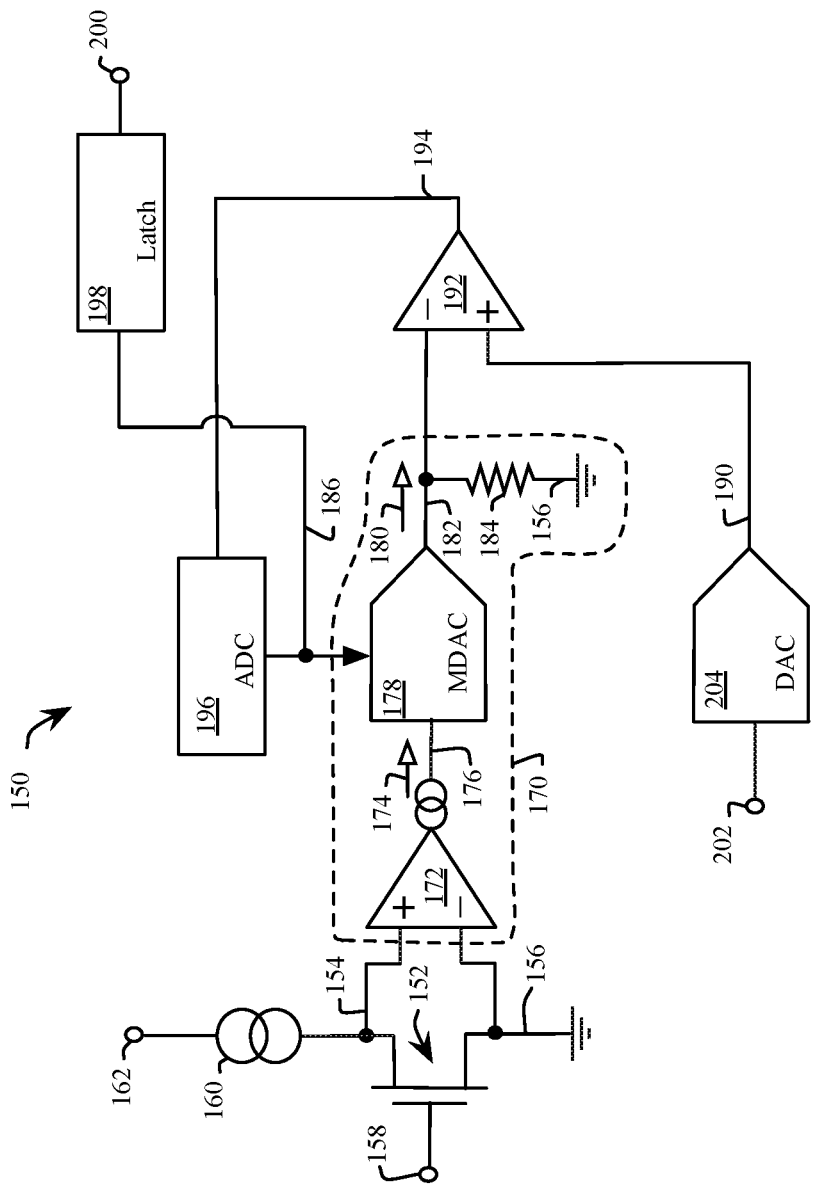
FIG. 6 is a schematic view of a calibration circuit in accordance with an example embodiment of the present disclosure.

Turning now to FIG. 5 and FIG. 6, example embodiments of a current sense system in accordance with the present disclosure are described. In FIG. 5, an embodiment 70 includes a high-side transistor (e.g., a power FET) 72 having a drain connected to a voltage supply 74 and a source connected to a phase node 76. A low-side transistor (e.g., a power FET) 78 has a drain connected to the phase node 76 and a source connected to a ground 80. A switch controller 90 communicates with a driver 92 over a connection 94, in response to a PWM signal 96. Specifically, the switch control 90 signals the driver 92 to activate a gate 100 of the high-side transistor 72 during a first timing phase, and to activate a gate 102 of the low-side transistor 78 during a second timing phase. The first timing phase and the second timing phase are non-overlapping. In one embodiment, the first timing phase and the second timing phase are the timing pulse 50 and the timing pulse 52 as shown in FIG. 3. In an example embodiment, the phase node 76 connects a load capacitor through a load inductor as shown in FIG. 1 and FIG. 2 and supplies a load current 104.

In an example embodiment, the high-side transistor 72 and the low-side transistor 78 have the same temperature coefficient and are driven by the same gate voltage during their respective timing phases. Specifically, the resistance between the respective drain and source, including the active channel and junction resistance, changes with respect to temperature at the same rate for both the high-side transistor 72 and the low-side transistor 78, and both transistors are of the same dopant type (e.g. N-channel FET). A current flowing through either the high-side transistor 72 or the low-side transistor 78 develops a respective transistor voltage across the respective resistance and is sensed with a respective current sense channel 110a or 110b.

The current sense channel 110a includes a transconductance amplifier 112a configured to sense the transistor voltage between the drain and source terminals of the high-side transistor 72 to generate an amplifier output current 114a on a node 116a. In an example embodiment, the transconductance amplifier 112a is active only when the high-side transistor 72 is active by activating the gate 100. Gating the activation of the transconductance amplifier 112a prevents saturation of this amplifier because the transistor voltage across the high-side transistor 72 will increase significantly when the high-side transistor 72 is deactivated. The amplifier output current 114a is adjusted by a Multiplying Digital to Analog Converter (Multiplying DAC or MDAC) 118a to generate a first calibration current 120a on the first calibration node 122a. The first calibration current 120a is sunk by a first calibration resistor 124a connected between the first calibration node 122a and the ground 80. Accordingly, a first calibration voltage is generated across the first calibration resistor 124a. The MDAC 118a adjusts the amplifier output current 114a by a gain determined by a gain coefficient 126 to produce the first calibration current 120a, hence the MDAC 118a is also referred to as a Current DAC or IDAC.

The current sense channel 110b includes a transconductance amplifier 112b configured to sense the transistor voltage between the drain and source terminals of the low-side transistor 78 to generate an amplifier output current 114b on a node 116b. In an example embodiment, the transconductance amplifier 112b is active only when the low-side transistor 78 is active by activating the gate 102. Gating the activation of the transconductance amplifier 112b prevents saturation of this amplifier because the transistor voltage across the low-side transistor 78 will increase significantly when the high-side transistor 72 is deactivated. The amplifier output current 114b is adjusted by an MDAC 118b to generate a second calibration current 120b on the second calibration node 122b. The second calibration current 120b is sunk by a second calibration resistor 124b connected between the second calibration node 122b and the ground 80. Accordingly, a second calibration voltage is generated across the second calibration resistor 124b. The MDAC 118b adjusts the amplifier output current 114b by a gain determined by the gain coefficient 126 to produce the second calibration current 120b, hence the MDAC 118b is also referred to as a Current DAC or IDAC.

The respective calibration voltages on the calibration nodes 122a and 122b are alternately connected with respective switches 130 and 132 controlled by respective control signals 134 and 136 to generate an output voltage 140. The control signals 124 and 136 are synchronized to the activation of the respective high-side transistor 72 and the low-side transistor 78. In an example embodiment, the high-side transistor 72, the transconductance amplifier 112a and the switch 130 are activated during a first time period. Similarly, the low-side transistor 78, the transconductance amplifier 112b and the switch 132 are activated during a second time period, wherein the first time period and the second time period are interleaved and non-overlapping.

In an example embodiment, an additional controller uses the output voltage 140 to control and generate the PWM signal 96. In another example embodiment, the output voltage 140 is used for monitoring over-voltage protection of a switching converter including the current sense system 70. In addition to the high-side transistor 72 and low-side transistor 78 having a same temperature coefficient and gate drive voltage, in an example embodiment a transistor gain of the high-side transistor 72 and low-side transistor 78 are designed to be the same through proper layout techniques. The term "transistor gain" refers to a channel width of a transistor divided by a channel length of the transistor.

In another example embodiment, a difference in the transistor gain between the high-side transistor 72 and low-side transistor 78 is compensated by either adjusting a gain of the MDAC 118a relative to the MDAC 118b or by adjusting a resistance of the calibration resistor 124a relative to the resistance of the calibration resistor 124b, or both. In one embodiment, the high-side transistor 72 and low-side transistor 78 are placed (e.g. "laid out") in close proximity to each other. In another example embodiment, the calibration resistors 124a and 124b have matched resistance. In another example embodiment, the calibration resistors 124a and 124b are designed to be in close proximity to one another including usage of common-centroid layout practices and the like.

FIG. 6 shows an embodiment 150 of a calibration circuit used to normalize the temperature dependency of the high-side transistor 72 and the low-side transistor 78 of FIG. 5. The embodiment 150 includes a reference transistor 152 having a drain 154, a source connected to a ground 156, and a gate 158. The gate 158 is continuously biased to a same value as the pulsed gate values generated by the driver 92 of FIG. 5, applied to the gates 100 and 102. The drain 154 is connected to a Zero Temperature Coefficient (ZTC) current source 160 supplied by a voltage source 162. In an example embodiment, the voltage source 162 is pulsed to enable current conduction through the reference transistor 152 only when calibration of the embodiment 70 of FIG. 5 is required.

In one example embodiment, calibration occurs continuously to achieve the most accurate temperature compensation of the embodiment 70. In another example, calibration occurs infrequently when operating voltage and temperatures are relatively stable, and previously latched calibration values are used. In another embodiment, a temperature and/or voltage monitor is used to trigger an update of calibration values when the temperature and/or voltage changes by a respective threshold value.

In another example embodiment, the transistor gain for the reference transistor 152 is less than the transistor gain of either the high-side transistor 72 or the low-side transistor 78 of FIG. 5, thereby reducing power consumption. Similar to the compensation methods described for transistor gain imbalances between the high-side transistor 72 and the low-side transistor 78, the reduced gain of the reference transistor 152 is compensated by adjusting a gain of both of the MDACs 118a and 188b by the same amount, or by adjusting the resistance of both of the calibration resistors 124*a* and 124*b*, or by adjusting both the MDACs and calibration resistors in proportional amounts.

In one embodiment, the reference transistor 152 is placed in close proximity to the high-side transistor 72 and the low-side transistor 78 (e.g. "laid out"). In another example embodiment, a calibration resistor 184 of the embodiment 150 has a matched resistance to the calibration resistors 124*a* and 124*b*. In another example embodiment, the calibration resistors 184, 124*a* and 124*b* are designed to be in close proximity to one another including usage of common-centroid layout practices and the like.

The embodiment 150 includes a current sense channel 170 configured to sense a transistor voltage between the drain and source of the reference transistor 152 and to generate a calibration voltage on the calibration node 182. The current sense channel 170 includes a transconductance amplifier 172 connected between the drain and source of the reference transistor 152 and configured to sense a transistor voltage therebetween and to generate an amplifier output current 174 on a node 176. An MDAC 178 (also referred to as IDAC) receives the amplifier output current 174 and generates a calibration current 180 multiplied by a gain determined by the gain coefficient 186. The calibration voltage is formed on the calibration node 182 by a calibration resistor 184 connected to the ground 186 and configured to sink the calibration current 180. In an example embodiment, each of the calibration resistors 124*a*, 124*b* and 184 have a nominal resistance of 60 kilohms.

The calibration voltage on the calibration node 182 is compared against a target voltage 190 with a low offset comparator 192 to generate an error voltage 194. The error voltage 194 is converted by an Analog to Digital Converter (ADC) 196 to determine the gain coefficient 186. In an example embodiment, the ADC 196 is a sampling ADC. In another embodiment, the gain coefficient 186 has a data width of six bits. The resolution of the calibration is related to the number of bits of the gain coefficient 186. The target voltage 190 is determined by converting a target coefficient 202 with a DAC 204. With reference to FIG. 5 along with FIG. 6, in one embodiment, the target coefficient 202 is determined by measuring a calibration voltage of one of the current sense channels 110*a* or 110*b* corresponding to a gate bias on the respective gate 100 or 102, for a targeted load current 104 flowing flow an inductor (not shown), and for a targeted operating temperature, wherein the inductor is connected between the phase node 76 and a load capacitor (not shown). The target coefficient is determined to replicate the measured calibration voltage as the target voltage 190.

In an example embodiment, the target coefficient 202 is stored in a One Time Programmable memory, a set of polysilicon or metal fuses, an EPROM, an EEPROM or the like. In one embodiment, the target coefficient 202 is determined at a final package test. In another embodiment, the target coefficient 202 is determined at a wafer probe test. In one embodiment, the gain coefficient 186 generated by the ADC 196 is supplied directly to the MDACs 118*a* and 118*b*. In another embodiment, the gain coefficient 186 is averaged over a plurality of clock samples of the ADC 196 and stored in a latch 198 to provide an averaged gain coefficient 200 to the MDACs 118*a* and 118*b* as the gain coefficient 126, shown in FIG. 5.

Figure 7:
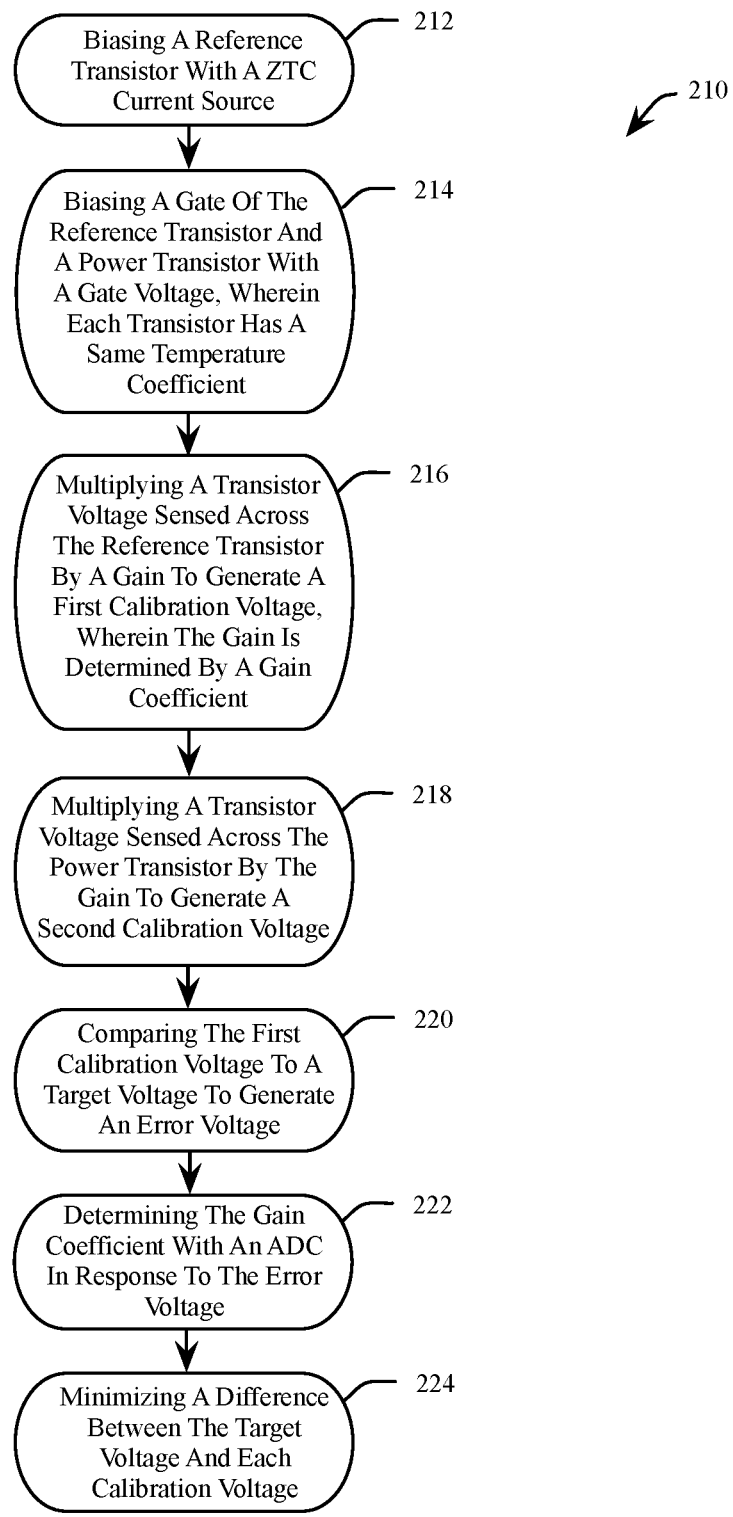
FIG. 7 is a flowchart representation of a method for dynamic calibration of current sense for switching converters in accordance with an example embodiment of the present disclosure.

Referring to FIGS. 5-7, FIG. 7 shows a method 210 for dynamic calibration of current sense for switching converters according to an example embodiment of the present disclosure. At 212, a reference transistor 152 is biased with a ZTC current source 160. At 214, a gate 158 of the reference transistor 152 and a power transistor 72 (or 78) is biased with a gate voltage, wherein each transistor has a same temperature coefficient. At 216, a transistor voltage sensed across the reference transistor 152 is multiplied by a gain to generate a first calibration voltage, wherein the gain is determined by a gain coefficient 186. At 218, a transistor voltage sensed across the power transistor 72 (or 78) is multiplied by the gain to generate a second calibration voltage. At 220, the first calibration voltage, formed from the reference transistor 152, is compared to a target voltage 190 to generate an error voltage 194. At 222, the gain coefficient 186 is determined with an ADC 196 in response to the error voltage 194. At 224, a difference between the target voltage 190 and each of the calibration voltages is minimized.

The dynamic calibration of current sense disclosed herein, provides for high-speed and stable sensing because the current sense channels 110*a* and 110*b* are in an open loop configuration. Furthermore, the calibration is largely independent of the PWM duty cycle, supply voltage changes and the load inductor value. The temperature calibration consumes very little current and operates over a variety of environments with varying degrees of temperature, voltage and process variation.

As will be appreciated, embodiments as disclosed include at least the following. In one embodiment, a system for dynamic calibration of current sense for switching converters comprises a first one, a second one and a third one of a plurality of current sense channels configured to multiply a respective transistor voltage sensed across a respective transistor by a gain to generate a respective calibration voltage across a respective resistor, wherein the gain is determined by a gain coefficient, and each respective transistor has a matching temperature coefficient and a respective gate. The respective transistor of the first one of the current sense channels is connected between a voltage supply and a phase node. The respective calibration resistor is connected to an output by a respective switch during a first phase. The respective gate is biased to a first voltage during the first phase. The respective transistor of the second one of the current sense channels is connected between the phase node and a ground. The respective calibration resistor is connected to the output by a respective switch during a second phase not overlapping in time with the first phase. The respective gate is biased to the first voltage during the second phase. The respective transistor of the third one of the current sense channels is connected between a Zero Temperature Coefficient (ZTC) current source and the ground. The respective gate is biased to the first voltage. A comparator is configured to compare the respective calibration voltage of the third sense channel to a target voltage to generate an error voltage. An Analog to Digital Converter is configured to convert the error voltage into the gain coefficient, thereby minimizing the error voltage and a difference between the target voltage and each respective calibration voltage.

In another embodiment, a method for dynamic calibration of current sense for switching converters comprises biasing a reference transistor with a Zero Temperature Coefficient (ZTC) current source, and a respective gate of each of the reference transistor and a power transistor with a gate voltage, wherein each of the reference transistor and the power transistor comprise a matching temperature coefficient. A reference voltage sensed across the reference transistor is multiplied by a first gain, thereby generating a first calibration voltage, wherein the first gain is determined by a gain coefficient. A transistor voltage sensed across the power transistor is multiplied by the first gain, thereby generating a second calibration voltage. The first calibration voltage is compared to a target voltage to generate an error voltage. The gain coefficient is determined with an Analog to Digital Converter in response to the error voltage, thereby minimizing the error voltage and a difference between the target voltage and each of the first calibration voltage and the second calibration voltage.

In another embodiment, an apparatus for dynamic calibration of current sense for switching converters comprises a first one of a plurality of current sense is channels configured to multiply by a first gain, a first voltage sensed between a first drain and a first source of a first transistor, and to generate a first calibration voltage therefrom, wherein the first gain is defined by a gain coefficient, and wherein a first gate voltage on a first gate of the first transistor controls a first current flowing between the first drain and the first source. A second one of the plurality of current sense channels is configured to multiply by the first gain, a second voltage sensed between a second drain and a second source of a second transistor, and to generate a second calibration voltage therefrom. The second drain is connected to a Zero Temperature Coefficient (ZTC) current source. The second source is connected to a ground. A second gate of the second transistor is biased to the first gate voltage and a first temperature coefficient of the first transistor is equal to a second temperature coefficient of the second transistor. A comparator is configured to generate an error voltage from a difference between the second calibration voltage and a target voltage. An Analog to Digital Converter is configured to determine the gain coefficient proportional to the error voltage, thereby minimizing the error voltage and a difference between the target voltage and each of the first calibration voltage and the second calibration voltage.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A system for dynamic calibration of current sense for switching converters comprising:
   a first one, a second one and a third one of a plurality of current sense channels configured to multiply a respective transistor voltage sensed across a respective transistor by a gain to generate a respective calibration voltage across a respective resistor, wherein the gain is determined by a gain coefficient, and each respective transistor has a matching temperature coefficient and a respective gate,
   the respective transistor of the first one of the current sense channels connected between a voltage supply and a phase node, the respective calibration resistor connected to an output by a respective switch during a first phase, and the respective gate biased to a first voltage during the first phase,
   the respective transistor of the second one of the current sense channels connected between the phase node and a ground, the respective calibration resistor connected to the output by a respective switch during a second phase not overlapping in time with the first phase, and the respective gate biased to the first voltage during the second phase,
   the respective transistor of the third one of the current sense channels connected between a Zero Temperature Coefficient (ZTC) current source and the ground, and the respective gate biased to the first voltage;
   a comparator configured to compare the respective calibration voltage of the third sense channel to a target voltage to generate an error voltage; and
   an Analog to Digital Converter configured to convert the error voltage into the gain coefficient, thereby minimizing the error voltage and a difference between the target voltage and each respective calibration voltage.

2. The system of claim 1 wherein each of the current sense channels comprises a transconductance amplifier configured to sense the respective transistor voltage, a Multiplying Digital to Analog Converter configured to multiply an amplifier output current of the transconductance amplifier by the gain to provide a calibration current, and the calibration resistor configured to sink the calibration current to generate the calibration voltage.

3. The system of claim 1 wherein a latch is configured to store an averaged gain coefficient of a plurality of samples of the gain coefficient, and the gain of the first one and the second one of the current sense channels is determined by the averaged gain coefficient.

4. The system of claim 1 further comprising a load inductor connected between the phase node and a load capacitor, wherein a regulated voltage of the switching converter is formed on the load capacitor.

5. The system of claim 4 wherein the target voltage is determined by measuring a respective calibration voltage of the third one of the current sense channels corresponding the respective transistor biased to the first voltage and an average target current flowing though the load inductor.

6. The system of claim 1 wherein the gain coefficient is determined while the ZTC current source is activated with a pulsed source.

7. A method for dynamic calibration of current sense for switching converters comprising:
   biasing a reference transistor with a Zero Temperature Coefficient (ZTC) current source, and a respective gate of each of the reference transistor and a power transistor with a gate voltage, wherein each of the reference transistor and the power transistor comprises a matching temperature coefficient;
   multiplying a reference voltage sensed across the reference transistor by a first gain, thereby generating a first calibration voltage, wherein the first gain is determined by a gain coefficient;
   multiplying a transistor voltage sensed across the power transistor by the first gain, thereby generating a second calibration voltage;
   comparing the first calibration voltage to a target voltage to generate an error voltage; and
   determining the gain coefficient with an Analog to Digital Converter in response to the error voltage, thereby minimizing the error voltage and a difference between the target voltage and each of the first calibration voltage and the second calibration voltage.

8. The method of claim 7 further comprising activating the ZTC current source with a pulsed current source, wherein the gain coefficient is determined while the ZTC current source is activated.

9. The method of claim 7 wherein generating the first calibration voltage further comprises sensing the reference voltage with a transconductance amplifier, converting an amplifier output of the transconductance amplifier with a Multiplying Digital to Analog Converter (MDAC) controlled by the first gain and generating the first calibration voltage by sinking an calibration current generated by the MDAC through a calibration resistor.

10. The method of claim 9 further comprising compensating for a difference in a transistor gain between the reference transistor and the power transistor by changing a second gain of the MDAC.

11. The method of claim 9 further comprising compensating for a difference in a transistor gain between the reference transistor and the power transistor by changing a first resistance value of the calibration resistor used to determine the first calibration voltage relative to a second resistance value of a second calibration resistor used to determine the second calibration voltage.

12. The method of claim 9 further comprising deactivating the transconductance amplifier in response to deactivating the power transistor.

13. The method of claim 7 further comprising determining the target voltage by measuring the first calibration voltage corresponding to the reference transistor biased by the gate voltage and an average target current flowing through a load inductor connected between a load capacitor and the power transistor.

14. An apparatus for dynamic calibration of current sense for switching converters comprising:
 a first one of a plurality of current sense channels configured to multiply by a first gain, a first voltage sensed between a first drain and a first source of a first transistor, and to generate a first calibration voltage therefrom, wherein the first gain is defined by a gain coefficient, and wherein a first gate voltage on a first gate of the first transistor controls a first current flowing between the first drain and the first source;
 a second one of the plurality of current sense channels configured to multiply by the first gain, a second voltage sensed between a second drain and a second source of a second transistor, and to generate a second calibration voltage therefrom, the second drain connected to a Zero Temperature Coefficient (ZTC) current source, the second source connected to a ground, a second gate of the second transistor biased to the first gate voltage and a first temperature coefficient of the first transistor equal to a second temperature coefficient of the second transistor;
 a comparator configured to generate an error voltage from a difference between the second calibration voltage and a target voltage; and
 an Analog to Digital Converter configured to determine the gain coefficient proportional to the error voltage, thereby minimizing the error voltage and a difference between the target voltage and each of the first calibration voltage and the second calibration voltage.

15. The apparatus of claim 14 wherein each of the current sense channels comprises a respective transconductance amplifier configured to sense a respective voltage between a respective drain and a respective source of the respective transistor, a respective Multiplying Digital to Analog Converter configured to multiply a respective amplifier output current of the respective transconductance amplifier by the first gain to provide a respective calibration current, and a respective calibration resistor configured to sink the respective calibration current to generate the respective calibration voltage.

16. The apparatus of claim 15 wherein each of the respective calibration resistors of the current sense channels has a same resistance.

17. The apparatus of claim 14 wherein a first transistor gain of the first transistor is greater than a second transistor gain of the second transistor, thereby reducing a second transistor current.

18. The apparatus of claim 17 wherein a difference between the first transistor gain and the second transistor gain is compensated by a proportional change in a second gain of a respective Multiplying Digital to Analog Converter (MDAC) of the first one of the plurality of current sense channels, wherein the respective MDAC is configured to multiply the first voltage by the first gain to generate the first calibration voltage.

19. The apparatus of claim 17 wherein a difference between the first transistor gain and the second transistor gain is compensated by a proportional change in a resistance of a respective resistor of the first one of the plurality of current sense channels, wherein the respective resistor is configured to generate the first calibration voltage from a first calibration current.

20. The apparatus of claim 14 wherein further comprising a switch configured to periodically activate the ZTC current source while the gain coefficient is determined.

* * * * *